US011497145B2

(12) United States Patent
Lee et al.

(10) Patent No.: US 11,497,145 B2
(45) Date of Patent: Nov. 8, 2022

(54) SERVER RACK AND DATA CENTER INCLUDING A HYBRID-COOLED SERVER

(71) Applicant: National University of Singapore, Singapore (SG)

(72) Inventors: Poh Seng Lee, Singapore (SG); Yong Jie Chen, Singapore (SG); Matthew Lee Liong Law, Singapore (SG); Navin Raja Kuppusamy, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 17/251,496

(22) PCT Filed: Aug. 7, 2019

(86) PCT No.: PCT/SG2019/050392
§ 371 (c)(1),
(2) Date: Dec. 11, 2020

(87) PCT Pub. No.: WO2020/040694
PCT Pub. Date: Feb. 27, 2020

(65) Prior Publication Data
US 2021/0274683 A1    Sep. 2, 2021

(30) Foreign Application Priority Data

Aug. 21, 2018   (SG) .......................... 10201807100Y

(51) Int. Cl.
*H05K 7/20* (2006.01)
*H01L 23/473* (2006.01)

(52) U.S. Cl.
CPC ..... *H05K 7/20763* (2013.01); *H05K 7/20254* (2013.01); *H05K 7/20745* (2013.01); *H01L 23/473* (2013.01)

(58) Field of Classification Search
CPC . H05K 7/20745; H05K 7/20763–2079; H05K 7/20218; H05K 7/20254
USPC ......................... 361/679.46–679.54, 688–723
See application file for complete search history.

(56) References Cited

U.S. PATENT DOCUMENTS

| | | | |
|---|---|---|---|
| 7,400,505 B2 * | 7/2008 | Campbell | H05K 7/20772 165/185 |
| 7,477,514 B2 | 1/2009 | Campbell et al. | |
| 7,486,513 B2 | 2/2009 | Hall et al. | |
| 7,578,337 B2 * | 8/2009 | Spokoiny | H05K 7/20254 165/109.1 |
| 7,800,900 B1 | 9/2010 | Noteboom et al. | |

(Continued)

FOREIGN PATENT DOCUMENTS

| | | |
|---|---|---|
| CN | 106132176 A | 11/2016 |
| CN | 107960049 A | 4/2018 |

(Continued)

*Primary Examiner* — Zachary Pape
(74) *Attorney, Agent, or Firm* — Nixon Peabody LLP; Thomas P. Pavelko

(57) ABSTRACT

A server (10), a server rack (50) and a data centre (100, 150) are provided. The server (10) includes a housing (12) defining a gaseous flow passage. A plurality of active components (14) and a plurality of passive components (16) are provided in the housing (12). A plurality of liquid cooling devices (18) is attached to respective ones of the active components (14).

12 Claims, 7 Drawing Sheets

(56) References Cited

U.S. PATENT DOCUMENTS

| | | | |
|---|---|---|---|
| 7,957,132 B2 | 6/2011 | Fried | |
| 7,969,727 B2 * | 6/2011 | Tozer | H05K 7/20827 361/679.5 |
| 9,445,529 B2 | 9/2016 | Chainer et al. | |
| 9,683,794 B2 * | 6/2017 | Marchetti | F28F 27/02 |
| 10,238,011 B1 * | 3/2019 | Cui | H05K 7/20781 |
| 2005/0259397 A1 | 11/2005 | Bash et al. | |
| 2009/0133866 A1 | 5/2009 | Campbell et al. | |
| 2011/0132579 A1 | 6/2011 | Best et al. | |
| 2013/0205822 A1 * | 8/2013 | Heiland | F25D 31/00 62/259.2 |
| 2015/0237767 A1 * | 8/2015 | Shedd | F28F 9/26 165/104.31 |
| 2017/0231118 A1 | 8/2017 | Cader et al. | |
| 2018/0066663 A1 * | 3/2018 | Kulkarni | H05K 7/20172 |

FOREIGN PATENT DOCUMENTS

| | | |
|---|---|---|
| CN | 108024480 A | 5/2018 |
| WO | 2007140110 A2 | 12/2007 |
| WO | 2016069271 A1 | 5/2016 |

\* cited by examiner

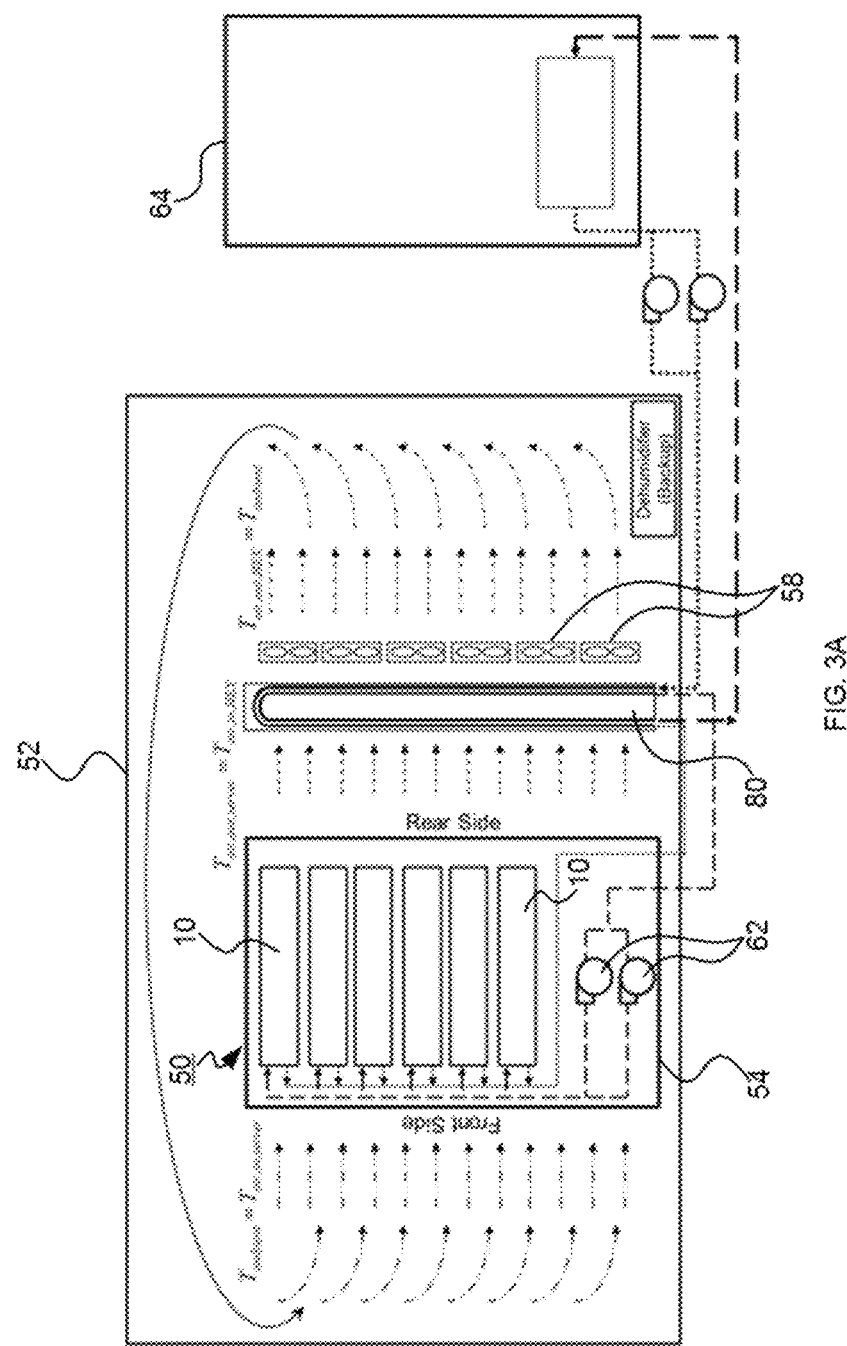

SERVER RACK AND DATA CENTER INCLUDING A HYBRID-COOLED SERVER

CROSS-REFERENCE TO RELATED APPLICATIONS

This application is a 35 U. S. C. § 371 United States National Stage application of International Patent Cooperation Treaty application serial number PCT/SG2019/050392, filed 7 Aug. 2019, entitled "SERVER, SERVER RACK AND DATA CENTRE," which, in turn, claims priority to Singapore application number 10201807100Y, filed 21 Aug. 2018, the entire contents of which are herein incorporated by reference in their entirety.

FIELD OF THE INVENTION

The present invention relates to the field of information technology (IT) infrastructure and more particularly to a server, a server rack and a data centre.

BACKGROUND OF THE INVENTION

Due to widespread and increased usage of electronic devices, there is now ever-increasing demand for data and this has translated into an increased demand for data centres as well.

Amongst the challenges faced in the provision and management of data centres is the need to improve utilisation of power, cooling and physical capacities.

It would therefore be desirable to provide a server, a server rack and a data centre that help achieve better cooling, power and space efficiencies.

SUMMARY OF THE INVENTION

Accordingly, in a first aspect, the present invention provides a server. The server includes a housing defining a gaseous flow passage. A plurality of active components and a plurality of passive components are provided in the housing. A plurality of liquid cooling devices is attached to respective ones of the active components.

In a second aspect, the present invention provides a server rack. The server rack includes a frame and a plurality of the servers in accordance with the first aspect mounted to the frame. One or more heat exchangers are arranged to remove heat from a cooling liquid and a gaseous flow passing through the servers. The one or more heat exchangers includes a first heat exchanger provided downstream of the gaseous flow passage of the servers. A plurality of fans is arranged to draw ambient air through the servers and the first heat exchanger.

In a third aspect, the present invention provides a data centre. The data centre includes a space and a plurality of the server racks in accordance with the second aspect housed within the space. The space is without a raised floor and an overhead plenum for a ducting network.

Other aspects and advantages of the invention will become apparent from the following detailed description, taken in conjunction with the accompanying drawings, illustrating by way of example the principles of the invention.

BRIEF DESCRIPTION OF THE DRAWINGS

Embodiments of the invention will now be described, by way of example only, with reference to the accompanying drawings, in which:

FIG. 3A is a schematic diagram of a server rack in a data centre room in accordance with another embodiment of the present invention;

DETAILED DESCRIPTION OF EXEMPLARY EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the scope of the invention.

Figure 1A:
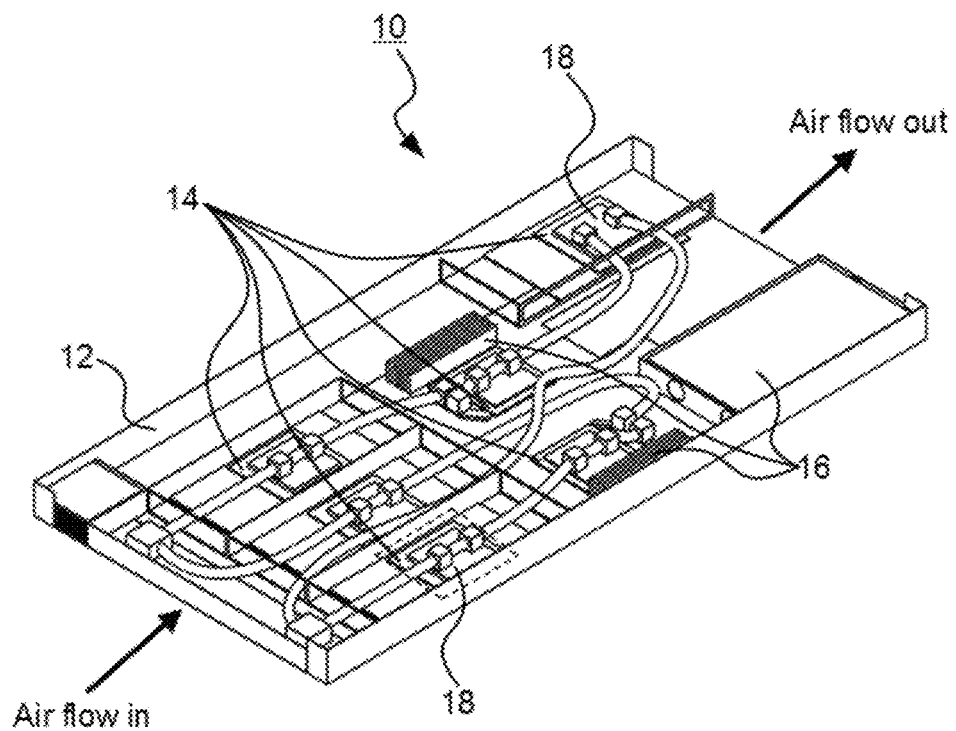
FIG. 1A is a schematic perspective view of a server in accordance with an embodiment of the present invention.

Referring now to FIG. 1, a server 10 is shown. The server 10 includes a housing 12 defining a gaseous flow passage. A plurality of active components 14 and a plurality of passive components 16 are provided in the housing 12. A plurality of liquid cooling devices 18 is attached to respective ones of the active components 14.

In this manner, the active components 14 such as, for example, central processing units (CPUs) and graphics processing units (GPUs), which dissipate a higher heat flux, are cooled by a liquid, whereas the passive components 16 such as, for example, memory modules and power supplies, which produce a lower heat flux, are cooled by air passing through the gaseous flow passage. A hybrid cooling system is thus provided in the server 10 that decouples the cooling load of the server 10 based on the heat flux of its components. Advantageously, this enables the air and liquid temperatures to be increased significantly (high ambient temperature) compared to a conventional data centre cooling system. By operating at a high ambient temperature and by liquid-cooling the active components 14, a data centre employing the hybrid-cooled server 10 may be able to achieve at least 50% reduction in air flow to cool the passive components 16. Furthermore, as the hybrid-cooled server 10 is operational in high ambient temperature, chillers and/or computer room air conditioning (CRAC) units, which are the main energy consumers in conventional data centre cooling systems, can be eliminated. This leads to tremendous energy savings for a data centre resulting in an ultra-low power utilization efficiency (PUE) data centre.

Figure 1B:
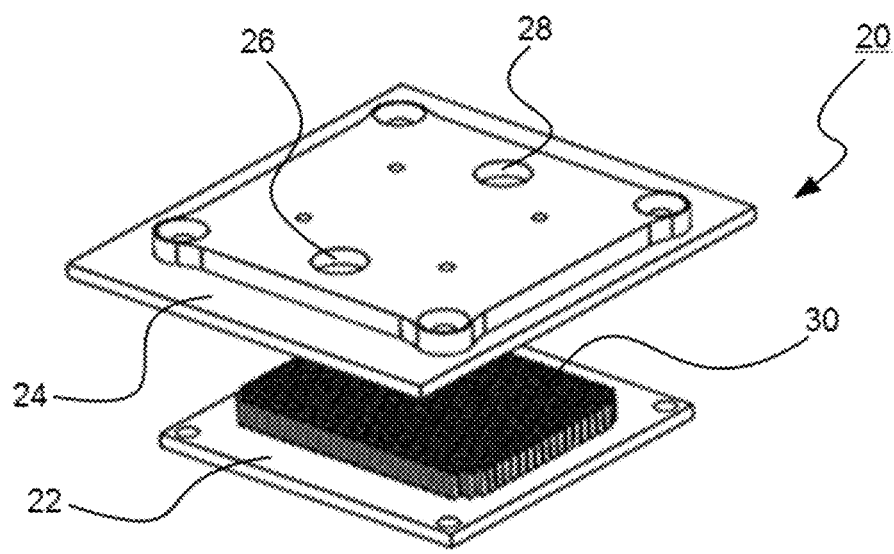
FIG. 1B is a schematic exploded view of a liquid cooling device employed in the server of FIG. 1A.

Referring now to FIG. 1B, each of the liquid cooling devices 18 may include a liquid-cooled heat sink assembly 20 as shown in FIG. 1B. The heat sink assembly 20 may include a thermally conductive base 22 and a cover 24 that is attachable to the thermally conductive base 22, the thermally conductive base 22 and the cover 24 defining a liquid flow passage. An inlet 26 may be provided in the cover 24 for receiving a liquid cooling medium or cooling liquid and an outlet 28 may be provided in the cover 24 for discharging the liquid cooling medium. An array of fins 30 in a spaced-apart relationship may be attached to the thermally conductive base 22 to increase the rate of heat transfer from the active components 14 to the liquid cooling medium passing through the heat sink assembly 20.

The heat sink assembly 20 may be attached to one of the active components 14 via the thermally conductive base 22 to provide direct contact liquid cooling. The thermally conductive base 22 may be a commercially available high-thermal conductivity pad with a thermal conductivity of between about 3 watts per metre Kelvin (W/m-K) and about 6 W/m-K such as, for example, an ARCTIC thermal pad, a 3M™ thermal conductive pad or a Bergquist™ thermal interface sheet. In alternative embodiments, the thermally conductive base 22 may be a commercially available high-thermal conductivity paste with a thermal conductivity of greater than 10 W/m-K such as, for example, Thermal Grizzly thermal grease or Cooler Master thermal paste.

Referring again to FIG. 1A, the liquid cooling devices 18 may be connected in series to ensure a more uniform flow distribution to individual active components 14 in the server 10 and this enhances the heat transfer performance of the server 10.

Figure 2:
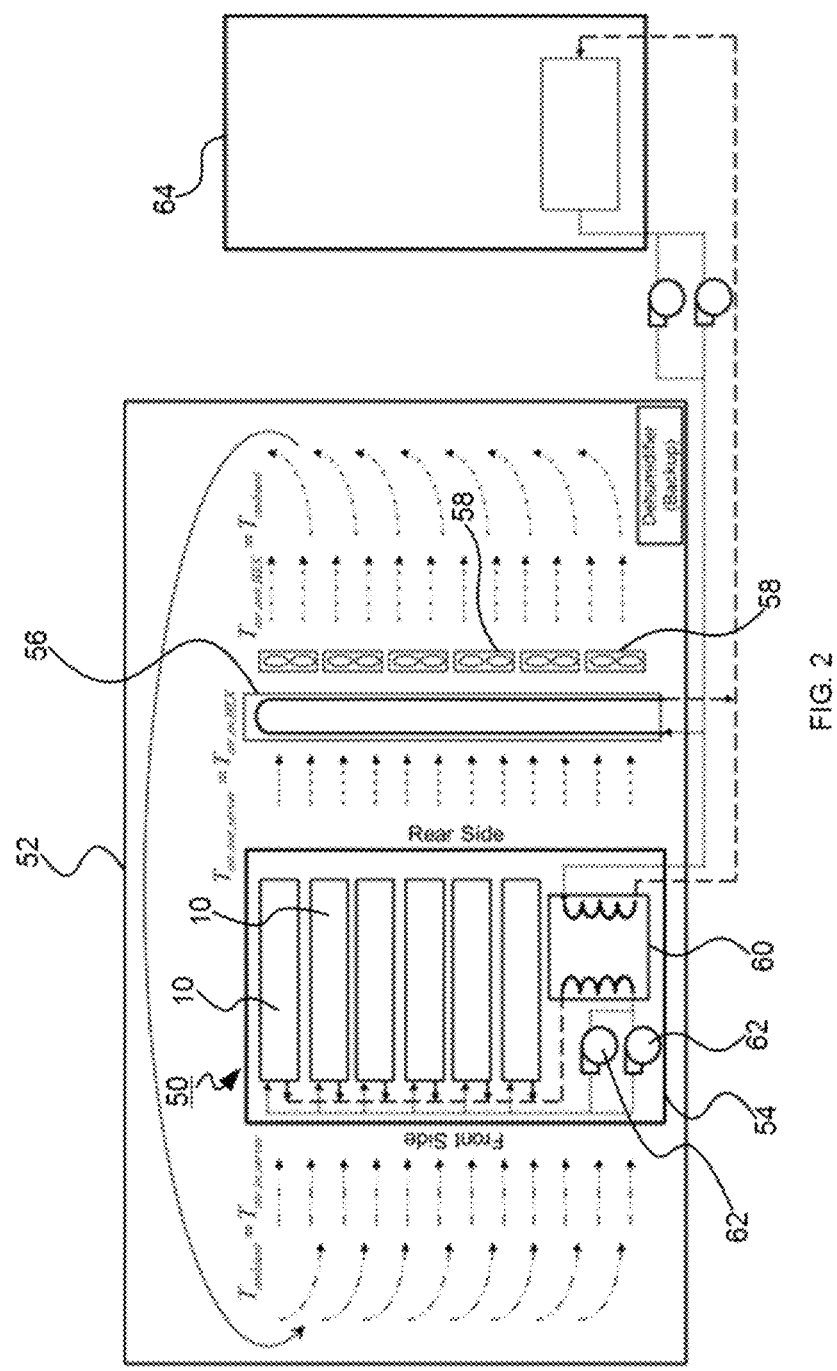
FIG. 2 is a schematic diagram of a server rack in a data centre room in accordance with an embodiment of the present invention.

Referring now to FIG. 2, a plurality of the hybrid-cooled servers 10 may be mounted to a server rack 50 in a data centre room 52. The server rack 50 may include a frame 54, the servers 10 being mounted to the frame 54. One or more heat exchangers may be arranged to remove heat from a cooling liquid and a gaseous flow passing through the servers 10, the one or more heat exchangers including a first heat exchanger 56 provided downstream of the gaseous flow passage of the servers 10. A plurality of fans 58 may be arranged to draw ambient air through the servers 10 and the first heat exchanger 56. In the present embodiment, the one or more heat exchangers includes a second heat exchanger 60 arranged to remove the heat generated by the active components of the servers 10 from the cooling liquid.

Advantageously, through the use of the servers 10, in-rack hybrid cooling for server heat removal is thus provided using a combination of liquid cooling (single- and two-phase) for high heat dissipating components such as, for example, microprocessors or graphic modules and air cooling for low heat dissipating components such as, for example, memory modules and power supplies. This enables the air and liquid temperatures to be increased significantly (high ambient temperature) compared to a conventional data centre cooling system.

The first heat exchanger 56 in the present embodiment may include a finned heat exchanger mounted to a rear door of the server rack 50 as a rear door heat exchanger (RDHx), the RDHx 56 being arranged to dissipate heat from heated air received from the servers 10 and return cooled air to the data centre room 52 at ambient temperature. The ambient air received by the servers 10 for cooling may be at a temperature of between about 40 degrees Celsius (° C.) and about 45° C.

The fans 58 may be attached behind the RDHx 56 to drive a flow of ambient air through the servers 10 and the RDHx 56, in particular, to draw the heated air from the servers 10 to the first heat exchanger 56 for cooling and thereafter to discharge the air cooled by the first heat exchanger 56 back into the ambient environment of the data centre room 52. By operating at a high ambient temperature and by liquid-cooling the active components 14, the hybrid cooling system is able to achieve at least 50% reduction in air flow to cool the passive components 16.

The second heat exchanger 60 in the present embodiment may include a plate heat exchanger (PHEX). The PHEX 60 may be provided at a bottom of the server rack 50. A plurality of pumps 62 may be provided to circulate the cooling liquid between the servers 10 and the second heat exchanger 60. The cooling liquid may be provided to the servers 10 at a temperature of between about 30 degrees Celsius (° C.) and about 40° C. Heated cooling liquid is returned from the servers 10 to the second heat exchanger 60 where the heat from the cooling liquid is transferred to a second cooling liquid. The second cooling liquid is circulated through a dry cooler 64 external to the data centre room 52 and heat from the second cooling liquid is then disposed to an external environment via the dry cooler 64.

The dry cooler 64 may be a liquid-to-air heat exchanger.

Under steady state conditions, the first heat exchanger 56 cools heated air at a temperature of, for example, about 48 degrees Celsius (° C.) from the passive components 16 of the servers 10 on the air-side, whilst on the liquid-side, the second heat exchanger 60 cools heated cooling liquid at a temperature of, for example, about 57° C. from the active components 14 of the servers 10. Both the heated air and the heated cooling liquid in the first heat exchanger 56 and the second heat exchanger 60, respectively, may be cooled by a warm liquid supply at a temperature of, for example, about 40° C. from the outdoor dry cooler 64. The liquid supply from the dry cooler 64 is warm due to air having a low heat transfer coefficient coupled with the warm outdoor air temperature of, for example, about 35° C. The cooled air discharged from the first heat exchanger 56 to the data centre room 52 is at a higher temperature of, for example, about 45° C. and is recirculated to cool the passive components 16 of the servers 10. With such a configuration, a higher ambient temperature of, for example, about 45° C. may be maintained within the data centre room 52.

Advantageously, rack-level air heat exchange eliminates the need for room-level cold air supply and hot air return, allowing for removal of raised floor and overhead plenum requirements. This in turn allows more racks or ultra-high density server racks 50 to be accommodated in a same volume of space.

Further advantageously, operation at high ambient temperature eliminates the need to use chillers and this dramatically improves cooling efficiency, resulting in ultra-low power usage effectiveness (PUE) for data centres.

In alternative embodiments, the server rack 50 may be coupled to different heat exchanger arrangements.

Figure 3B:
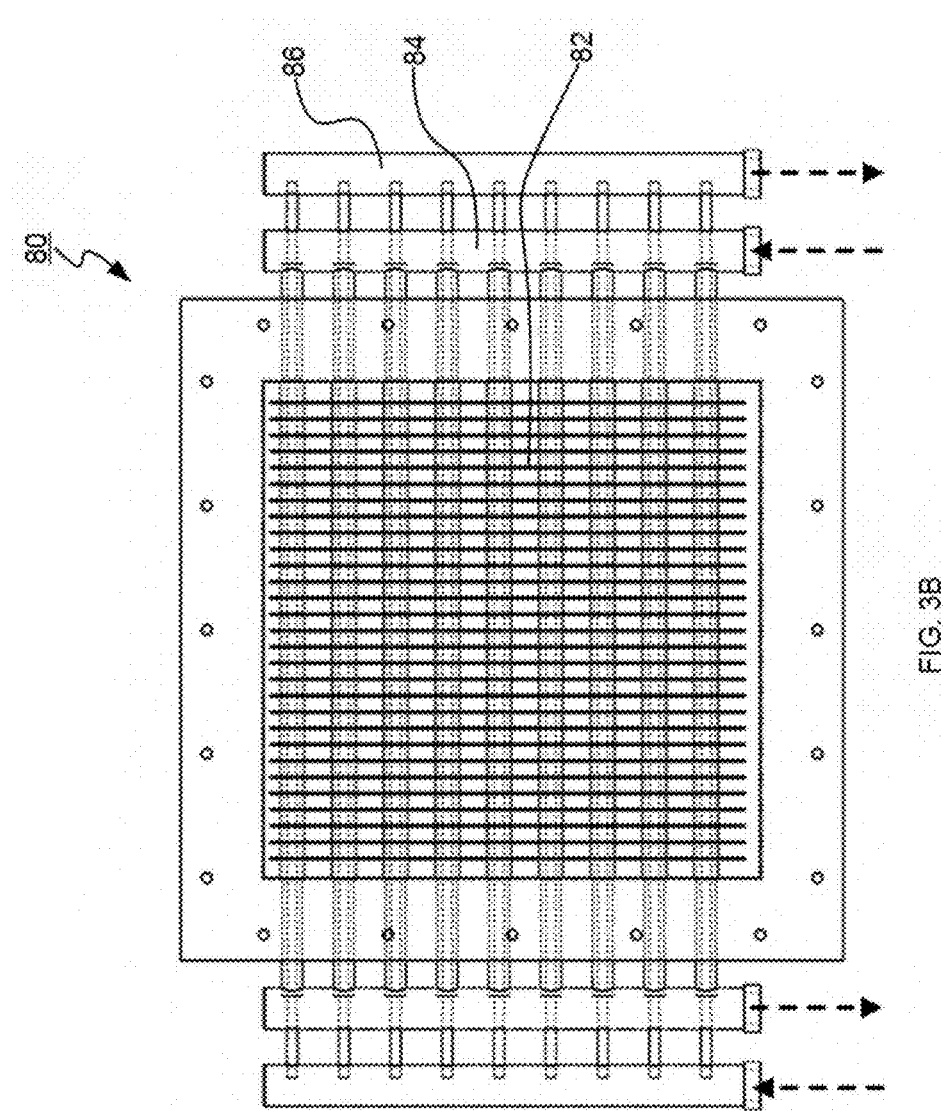
FIG. 3B is a schematic planar view of a heat exchanger employed in the server rack of FIG. 3A.

Referring now to FIGS. 3A and 3B, the first heat exchanger may instead be a triple-fluid heat exchanger (TFHEX) 80. The present embodiment differs from the previous embodiment in that the TFHEX 80 effectively combines the RDHx 56 and the PHEX 60 of the previous embodiment into a single heat exchanger which is capable of dissipating heat from two hot fluids (air and the cooling liquid) into a single cooling fluid (a second cooling liquid).

In the present embodiment, the ambient air at a raised temperature which dissipates heat from the passive components 16 may pass through a plurality of fins 82 of the TFHEX 80, whereas hot water which carries heat from the active components 14 may pass through a first series of tubes 84. Warm water which flows through a second series of tubes may be a common medium for both the hot water and the hot ambient air to release heat to. The heat dissipated to the warm water is released to the environment through the dry cooler 64.

In the present embodiment, each liquid flow loop through the servers 10 may be driven by redundant pump(s) 62 with all the pumps 62 running at equal capacity to meet the highest heat load. If one of the pumps 62 fails, the other pump(s) ramp up to meet the desired cooling demand.

The use of the TFHEX 80 enables high ambient temperature operations and completely eliminates the need for chilling and is thus truly free of cooling.

Figure 4A:
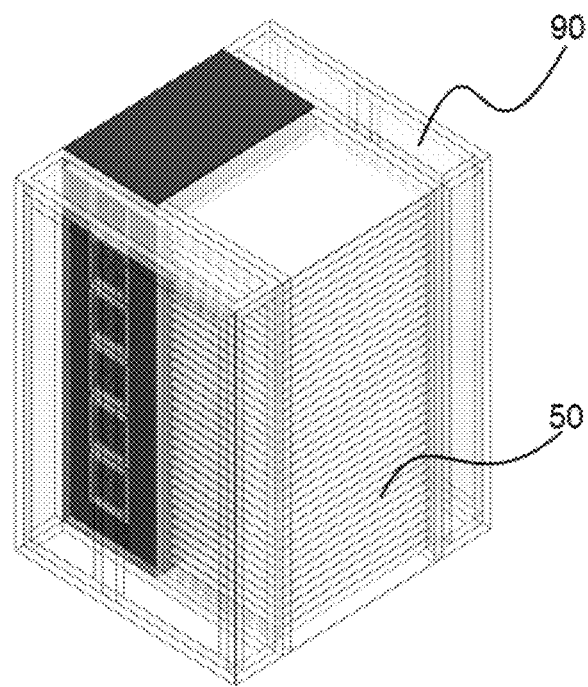
FIG. 4A is a schematic perspective view of a server rack housed in a containment unit in accordance with an embodiment of the present invention.
Figure 4B:
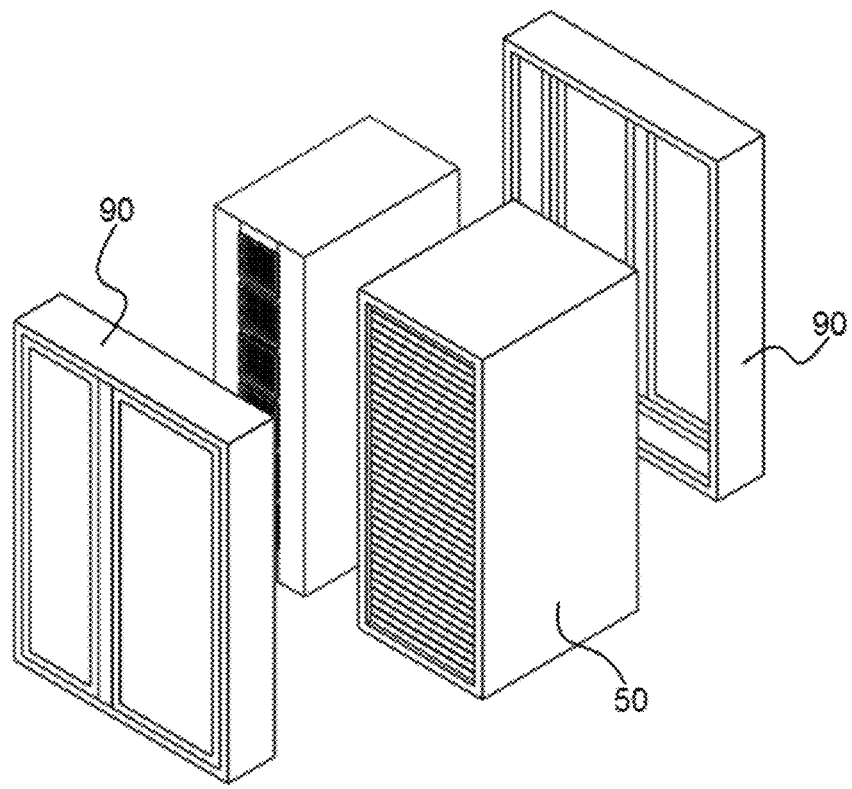
FIG. 4B is a schematic exploded view of the server rack and the containment unit of FIG. 4A.

Referring now to FIGS. 4A and 4B, the server rack 50 may be implemented in a conventional data centre space having a cold ambient temperature of, for example, about 27 degrees Celsius (° C.). In such an embodiment, the server rack 50 may be completely enclosed within a containment unit 90 such that the air temperature inside the containment unit 90 (e.g. 40-45° C.) is significantly higher compared to that of room air.

Although illustrated as having only one (1) server rack 50, the containment unit 90 may be customized and expanded to accommodate a plurality of server racks 50 within a single cooling unit.

Figure 5A:
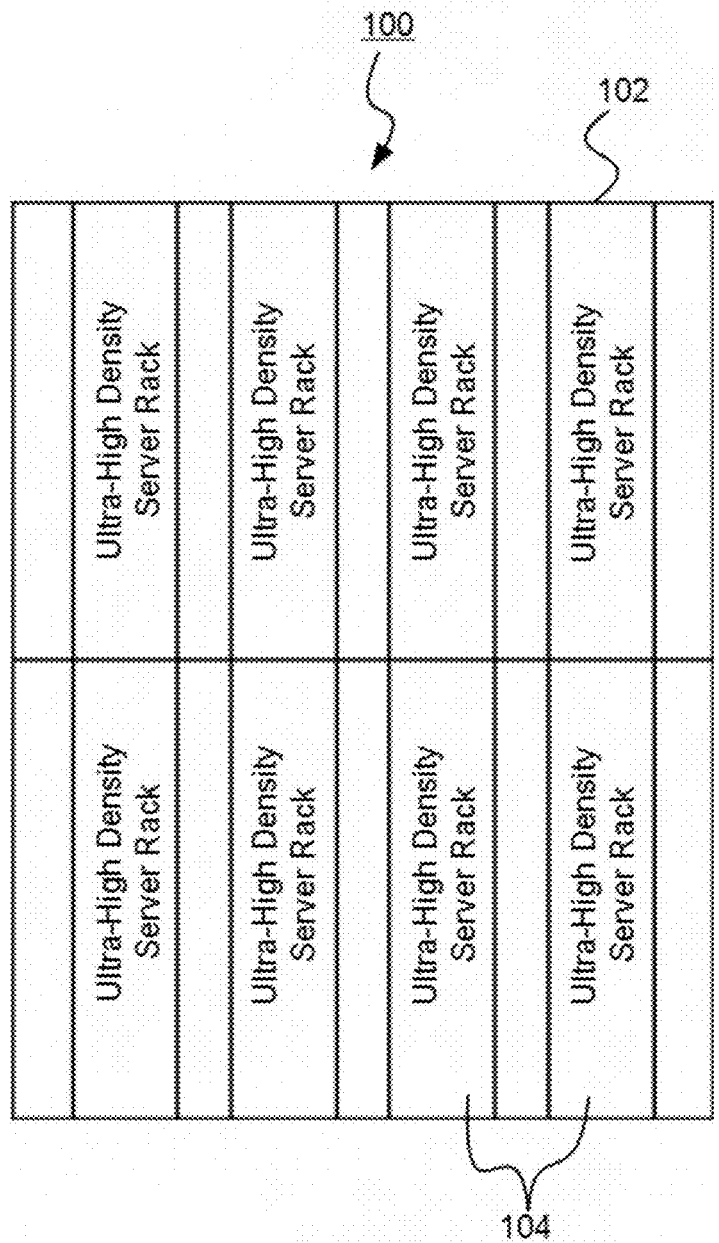
FIG. 5A is a schematic block diagram of a data centre in accordance with an embodiment of the present invention.

Referring now to FIG. 5A, a data centre 100 is shown. The data centre 100 includes a space 102 and a plurality of server racks 104 housed within the space 102. The space 102 is without a raised floor and an overhead plenum for a ducting network.

The coupling of the hybrid cooling system and heat exchanger(s) eliminates the requirement for piping and ducting networks for an air supply and a return of air. Consequently, the space 102 in the embodiment shown is without a raised floor and an overhead plenum for a ducting network. The freed-up space may then be utilized to house taller ultra-high density server racks 104 in the data centre 100. The ultra-high density server racks 104 may have a height of between about 50 rack units (U) and about 60 U. In one embodiment, each ultra-high density server rack 104 may have a height of 60 rack units (U). Further advantageously, ultra-tall server racks 104 provide a much higher server density of, for example, about 115 kilowatts (kW) per rack. Such an implementation may be suitable for brownfield data centres.

The coupling of the hybrid cooling system and heat exchanger(s) also enables high ambient temperature data centre operation. The data centre 100 may have an operational temperature of between about 40 degrees Celsius (° C.) and 45° C. Advantageously, this does away with the need for the provision of chillers and/or computer room air conditioning (CRAC) units. The space 102 may therefore be without a computer room air conditioning (CRAC) unit and/or a chiller.

Figure 5B:
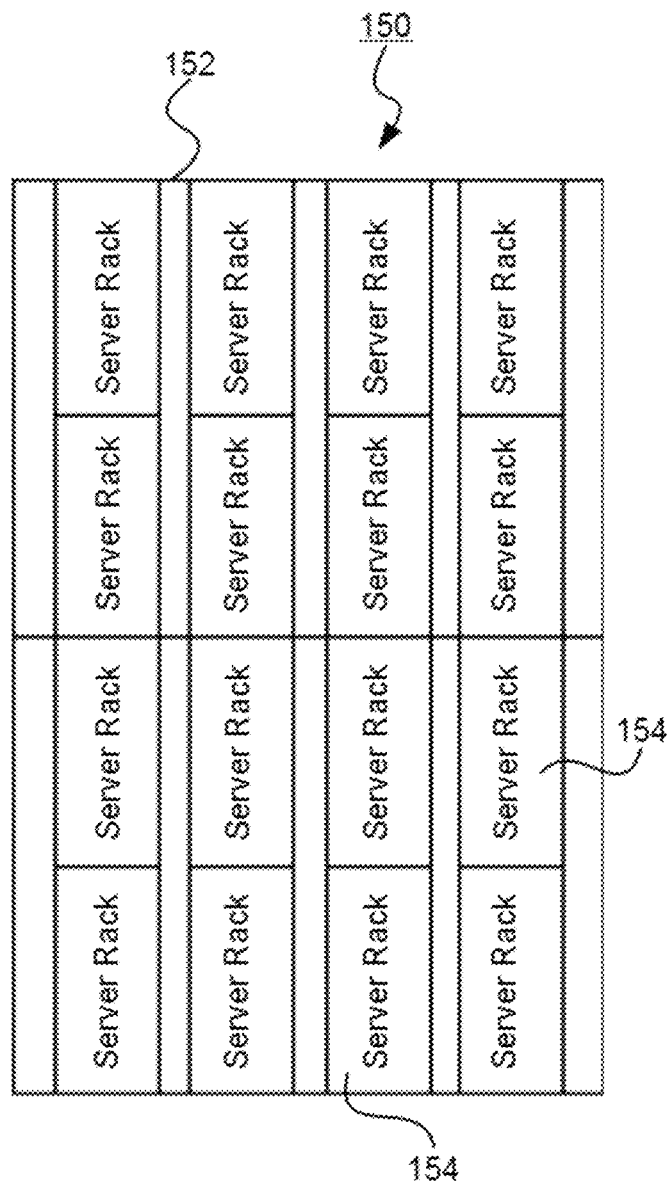
FIG. 5B is a schematic block diagram of a data centre in accordance with another embodiment of the present invention.

Referring now to FIG. 5B, a data centre 150 in accordance with another embodiment is shown. The data centre 150 includes a space 152 and a plurality of server racks 154 housed within the space 152. The space 152 is also without a raised floor and an overhead plenum for a ducting network.

The data centre 150 differs from the previous embodiment in that the data centre 150 is of a shorter floor height owing to the removal of the overhead plenum for air supply and the raised floor for air return. Advantageously, such multi-storey data centres are significantly denser as more real estate is made available for accommodating additional server racks 154, instead of being wasted on piping and ducting networks. Such an implementation may be suitable for greenfield data centres.

As is evident from the foregoing discussion, the present invention provides a server, a server rack and a data centre that help achieve better cooling, power and space efficiencies. Various levels of cooling are provided including at the server level with a hybrid cooling system and at the rack level using different heat exchangers. At the server level, better energy efficiency is achieved as cooling is catered for specific components in the server, in particular, by targeting high heat flux dissipating components with liquid cooling and low heat flux components with air cooling. The highly efficient hybrid cooling system in turn enables high ambient temperature operation. Because the data centre of the present invention is operational at high ambient temperature, the need for chilling, a raised floor for delivery of cold air and an overhead plenum for return of hot air are eliminated. Doing away with chillers and computer room air conditioning (CRAC) units translates into huge energy savings, which results in ultra-low power utilization efficiencies (PUE) in data centres of the present invention. Better space management is also achieved through elimination of the overhead plenum and the raised floor for piping and ducting networks, in particular, removal of the need for the overhead plenum and the raised floor allows for use of ultra-tall racks that are able to accommodate more servers and/or more floors in data centres of the present invention for more server racks.

While preferred embodiments of the invention have been illustrated and described, it will be clear that the invention is not limited to the described embodiments only. Numerous modifications, changes, variations, substitutions and equivalents will be apparent to those skilled in the art without departing from the scope of the invention as described in the claims.

Further, unless the context clearly requires otherwise, throughout the description and the claims, the words "comprise", "comprising" and the like are to be construed in an inclusive as opposed to an exclusive or exhaustive sense; that is to say, in the sense of "including, but not limited to".

The invention claimed is:

1. A server rack, comprising:
   a frame;
   a plurality of the servers mounted to the frame, each of the servers comprising:
   a housing defining a gaseous flow passage;
   a plurality of active components and a plurality of passive components provided in the housing; and
   a plurality of liquid cooling devices attached to respective ones of the active components;
   one or more heat exchangers arranged to remove heat from a cooling liquid and a gaseous flow passing through the servers, wherein the one or more heat exchangers comprises a first heat exchanger provided downstream of the gaseous flow passage of the servers, wherein the first heat exchanger comprises a triple-fluid heat exchanger; and
   a plurality of fans arranged to draw ambient air through the servers and the first heat exchanger.

2. The server rack according to claim 1, wherein the liquid cooling devices are connected in series.

3. The server rack according to claim 1, wherein each of the liquid cooling devices comprises a liquid-cooled heat sink assembly.

4. The server rack according to claim 1, wherein each of the liquid cooling devices comprises a liquid-cooled heat sink assembly, wherein the liquid-cooled heat sink assembly comprises: a thermally conductive base; a cover attachable to the thermally conductive base, wherein the thermally conductive base and the cover define a liquid flow passage;

an inlet provided in the cover for receiving a liquid cooling medium; and an outlet provided in the cover for discharging the liquid cooling medium.

5. The server rack according to claim 4, further comprising an array of cooling fins attached to the thermally conductive base.

6. The server rack according to claim 1, wherein the ambient air received by the servers for cooling is at a temperature of between 40 degrees Celsius (° C.) and 45° C.

7. The server rack according to claim 1, wherein the cooling liquid is provided to the servers at a temperature of between 30 degrees Celsius (° C.) and 40° C.

8. The server rack according to claim 1, wherein the first heat exchanger comprises a finned heat exchanger.

9. The server rack according to claim 1, wherein the server rack has a height of between about 50 rack units (U) and about 60 U.

10. A data centre, comprising:
a space; and
a plurality of the server racks in accordance with claim 1 housed within the space, wherein the space is without a raised floor and an overhead plenum for a ducting network.

11. The data centre according to claim 10, wherein the space is without a computer room air conditioning (CRAC) unit and/or a chiller.

12. The data centre according to claim 10 having an operational temperature of between about 40 degrees Celsius (° C.) and 45° C.

\* \* \* \* \*